(12) United States Patent
Mellberg et al.

(10) Patent No.: US 6,580,028 B1
(45) Date of Patent: Jun. 17, 2003

(54) EMI REDUCTION DEVICE

(75) Inventors: Hans T Mellberg, Santa Cruz, CA (US); Bertram Kim Cheong Chan, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/495,009

(22) Filed: Jan. 31, 2000

(51) Int. Cl.[7] .............................. H05K 9/00; H05K 7/20
(52) U.S. Cl. .................... 174/35 R; 361/712; 361/720; 361/816; 361/818
(58) Field of Search ................... 174/35 R, 35 GC; 361/688, 707, 709, 711, 712, 720, 722, 753, 799, 800, 816, 818; 439/92, 95, 108, 607

(56) References Cited

U.S. PATENT DOCUMENTS

| | | | |
|---|---|---|---|
| 5,031,028 A | * | 7/1991 | Galich et al. ............... 357/81 |
| 5,035,631 A | * | 7/1991 | Piorunneck et al. ......... 439/108 |
| 5,124,889 A | * | 6/1992 | Humbert et al. ............ 361/424 |
| 5,136,120 A | | 8/1992 | Craft et al. |
| 5,228,864 A | * | 7/1993 | Fusselman et al. ......... 439/108 |
| 5,241,453 A | * | 8/1993 | Bright et al. ............... 361/704 |
| 5,278,351 A | | 1/1994 | Herrick |
| 5,311,408 A | | 5/1994 | Ferchau et al. |
| 5,357,404 A | | 10/1994 | Bright et al. |
| 5,478,260 A | * | 12/1995 | Kaufman et al. ........... 439/609 |
| 5,513,996 A | * | 5/1996 | Annerino et al. ............. 439/95 |
| 5,545,843 A | * | 8/1996 | Arvidsson et al. ...... 174/35 GC |
| 5,880,930 A | | 3/1999 | Wheaton |
| 5,917,147 A | | 6/1999 | Lewis |
| 5,967,806 A | * | 10/1999 | Patterson ..................... 439/108 |

OTHER PUBLICATIONS

Mark I. Montrose, "EMC And The Printed Circuit Board, Design, Theory, and Layout Made Simple," The Institute of Electrical And Electronics Engineers, Inc., New York, pp. 70–74.

Intel, "330–Contact Slot Connector (SC330) Design Guidelines," Release Date: Sep. 1998, pp. 3–39.

\* cited by examiner

Primary Examiner—Dean A. Reichard
Assistant Examiner—Carmelo Oliva
(74) Attorney, Agent, or Firm—Clare Hartnett

(57) ABSTRACT

A grounding device for reducing EMI emissions generated from a processor module is herein disclosed. The processor module includes a printed circuit board (PCB), having electronic components generating unwanted electromagnetic emissions, and a thermal plate capacitively coupled to the PCB. The grounding device is coupled to a connector resident on a motherboard. The grounding device includes a number of spring contact fingers and mounting tabs. The mounting tabs are used to mount the grounding device to the motherboard in a desired position and to provide an electrical connection to the ground plane of the motherboard. The spring contact fingers enable the thermal plate to maintain physical and electrical contact with the grounding device.

4 Claims, 9 Drawing Sheets

EMI REDUCTION DEVICE

FIELD OF THE INVENTION

The present invention relates generally to electronic systems. More particularly, the invention relates to an electromagnetic interference (EMI) reduction device.

BACKGROUND OF THE INVENTION

A trend in the electronics industry is to generate smaller and faster electronic devices. As a result, these devices consume more power and hence, produce more heat. Excessive heat can cause significant damage to an electronic device thereby reducing its life. For this reason, various techniques are employed to eliminate or dissipate the heat generated from the electronic device. A heat sink is one such technique. A heat sink is thermally coupled to the electronic device and as such, allows the heat to flow from the electronic device through the heat sink to the surrounding open space.

In addition, the operation of these electronic devices is accompanied by the generation of electromagnetic radiation or energy. The emissions of the electromagnetic radiation can cause significant electronic interference or noise with other surrounding electronic circuitry. To reduce such disturbances, the source of these emissions is usually suppressed. However, the EMI suppression problem is further complicated when the electronic device is coupled to a heat sink. The heat sink acts as an antenna for the EMI energy thereby increasing the EMI emissions.

A common solution for suppressing EMI energy is to ground the heat sink. FIG. 1 illustrates an exemplary grounded heat sink. There is shown a heat sink 100 coupled to a grounded electronic device 102 that is mounted onto a printed circuit board (PCB) 104. In this example, the grounded electronic device 102 is a processor core having a silicon logic die 106. A thermal compound 108, such as a dielectric material, is placed between the heat sink 100 and the grounded electronic device 102 so that thermal contact is maintained and the heat generated by the device 102 is transferred to the heat sink 100.

Mounting fences 110 are positioned on four opposite sides of the PCB 104 in order to ground the heat sink 100. The mounting fences 110 are attached to the heat sink 100 and the PCB 104, which acts in this case as a ground plane. The mounting fences 110 provide a Faraday shield around the device 102 in order to shield the EMI energy generated from the clock circuitry internal to the processor 102 from effecting adjacent components and from releasing EMI energy outside of the heat sink 100.

Additional EMI suppression is provided by four sets of grounding pads 112a–112d on the PCB 104 that surround the processor 102, as shown in FIG. 2. The grounding pads 112 minimize or ground EMI noise generated by the switching of all the component pins under maximum capacitive load. Thus, the combination of the grounding pads and the grounded heat sink dissipates the heat from the processor core and grounds the EMI energy generated by the processor core.

As the internal clock speed of processors increase, these processors will require more extensive EMI reduction or grounding. In some cases, the grounded heat sink approach may not be suitable to effectively eliminate the EMI emissions since this approach has a longer grounding path. As such, grounding may need to be performed closer to the silicon logic die in order to create a shorter grounding path that effectively reduces the EMI energy emanating from the processor core.

Accordingly, there is a need for an EMI reduction technique that can minimize or eliminate EMI energy generated from a processor core closer to the source of the emissions and in such a manner that is cost efficient and easy to manufacture.

SUMMARY OF THE INVENTION

The present invention pertains to a mechanism for reducing EMI emissions generated from electronic components that are mounted on a PCB. In a first embodiment, the PCB is part of an electronic assembly that is mounted into a connector resident on a motherboard. The electronic assembly can be a processor module that includes a PCB and an electrically-conductive thermal plate that is capacitively coupled to the PCB. The PCB has a processor core that is the source of unwanted electromagnetic emissions. As such, a grounding mechanism or device is provided to reduce these emissions more effectively.

The grounding device is formed of a metallic spring material and includes a frame having a number of mounting tabs and spring contact fingers. The mounting tabs are used to affix the grounding device in a desired position relative to a connector on the motherboard and to maintain electrical contact with the ground plane of the motherboard. A number of mounting holes are made on the motherboard near the connector and extend through the thickness of the motherboard. Each mounting tab is soldered to a respective mounting hole thereby providing an electrical connection to the ground plane of the motherboard. The spring contact fingers are used to maintain a pressure contact between the connector and the thermal plate when the processor module is placed into the connector.

The grounding device is mounted onto the motherboard so that the grounding device is coupled to the connector. When force is applied to insert the processor module into the connector, the thermal plate slides on the outer surface of the grounding device which forces the spring contact fingers to deflect. The deflected spring contact fingers apply pressure against the thermal plate which causes the thermal plate to maintain a physical and electrical connection to the grounding device.

The grounding device has several benefits. First, it provides a short ground path from the source of the electromagnetic emissions to the ground plane. As a result of this shorter grounding path, the grounding device is more effective at reducing the electromagnetic emissions generated from the processor module. In addition, the grounding device is external to the connector which makes it easy to adapt it to various connector designs. Additionally, the grounding device offers a grounding reference plane which improves the signal integrity characteristics of the connector contacts by maintaining a more stable transmission line characteristic.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
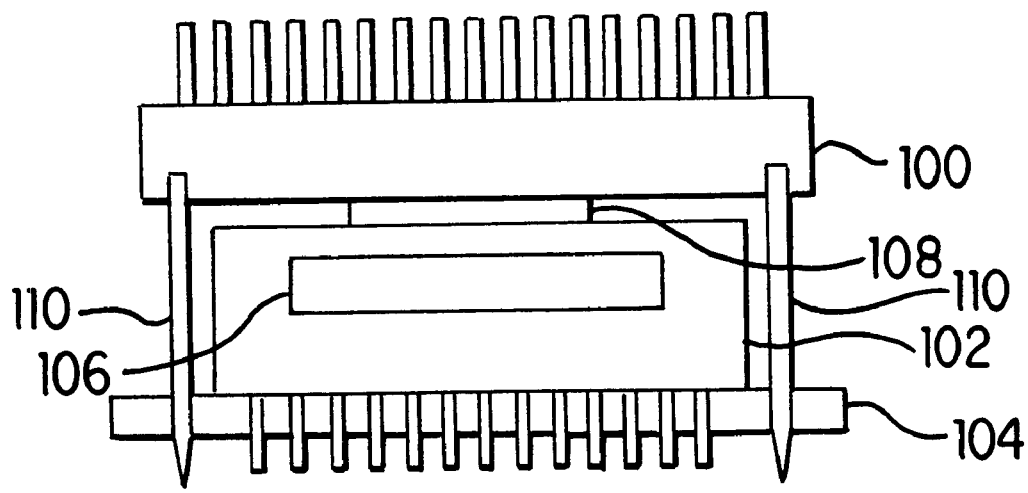
FIG. 1 is a schematic view of a prior art grounded heat sink assembly for a printed circuit board.
Figure 2:
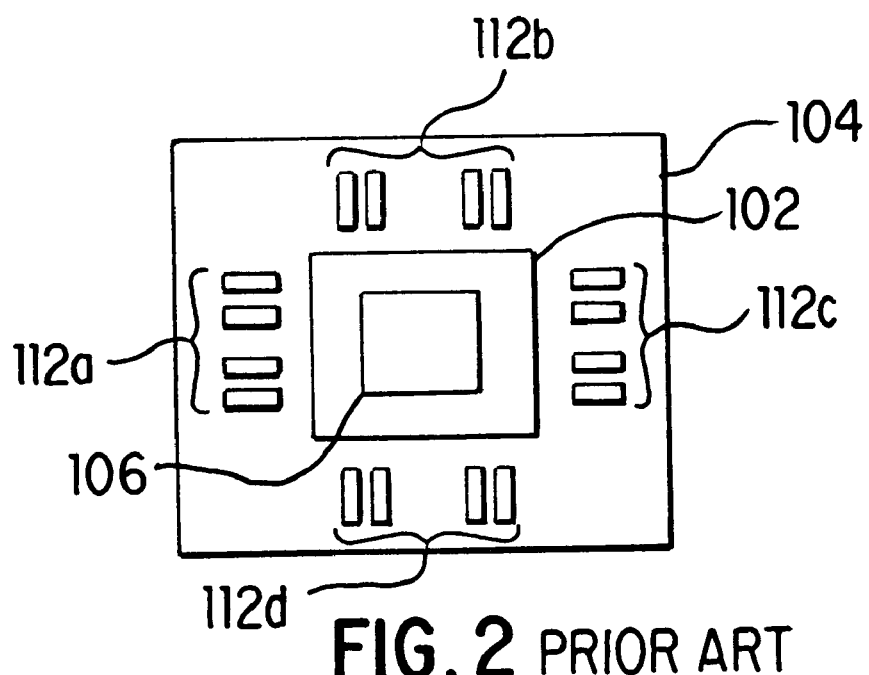
FIG. 2 is a top plan view of the printed circuit board used in the grounded heat sink assembly shown in FIG. 1.
Figure 3:
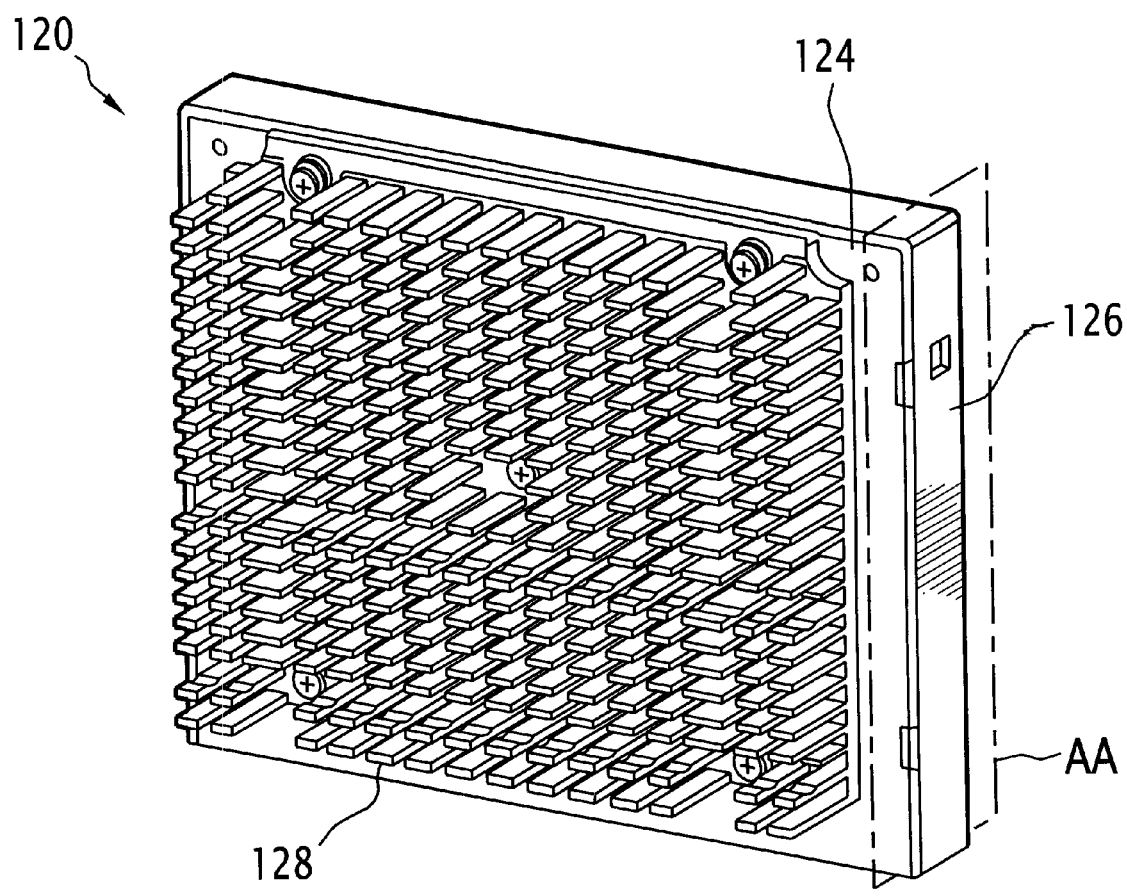
FIG. 3 is a perspective view of a processor module.
Figure 4:
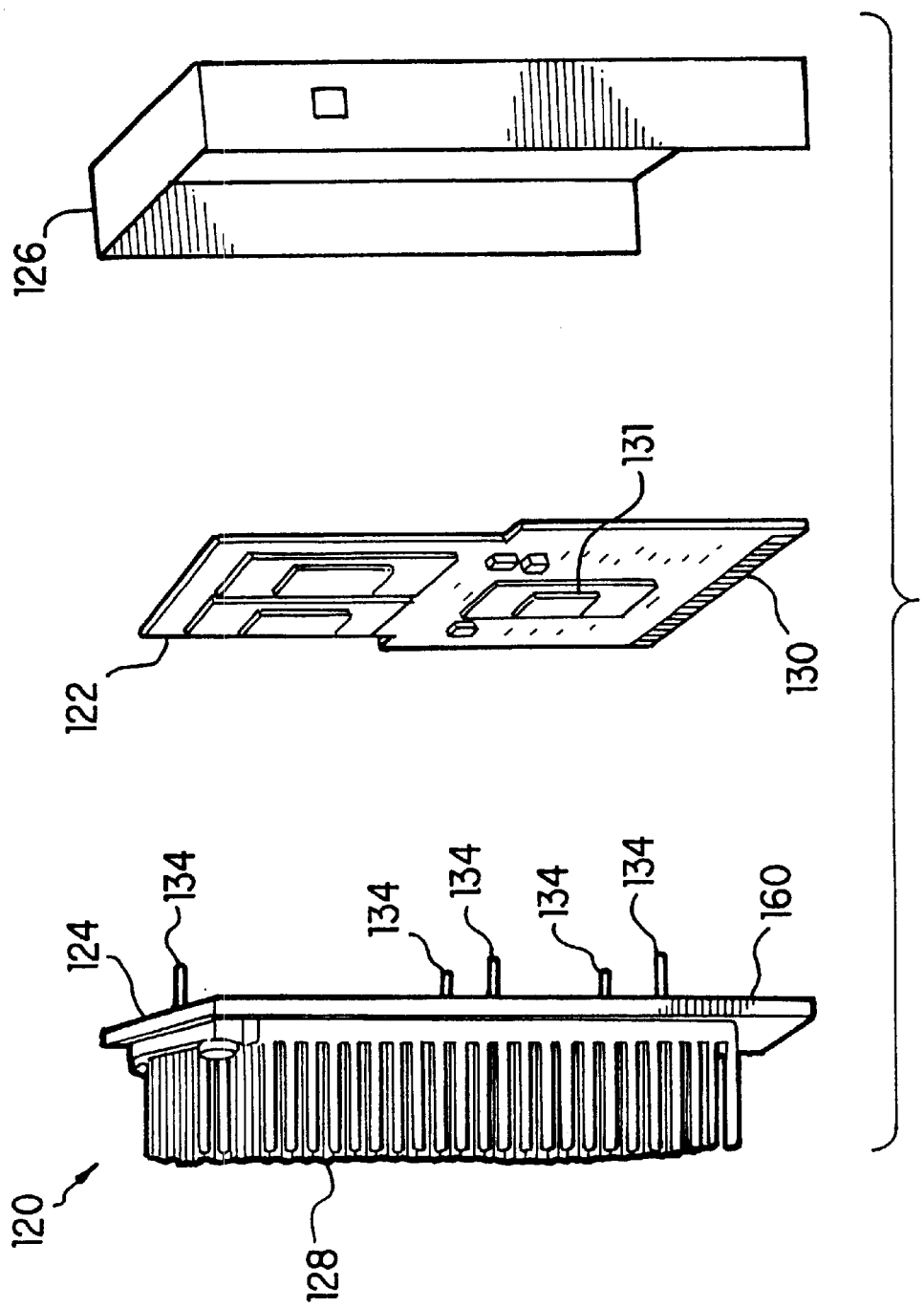
FIG. 4 is an exploded view of the components of the processor module shown in FIG. 3.

FIGS. 3 and 4 depict a processor module 120 having a PCB 122, a thermal plate 124, a cover 126, and a heat sink 128. The PCB 122 can be a substrate constructed of a multilayer plastic laminate, such as a plastic land grid array or organic land grid array processor core substrates. The PCB 122 has an edge finger connection 130. The cover 126 is used to protect the PCB 122 and is removably mounted to the PCB 122 and the thermal plate 124 through a set of snaps (not shown).

The PCB 122 includes a number of electronic components, one of which is a processor core 131 that can operate at frequencies above 500 MHz. The electromagnetic bandwidth of the processor core 131 can extend to include multiple times the advertised processor clock speed. For example, in the case of an Intel Pentium processor with an internal clock speed of 500 MHz, the EMI spectrum can extend to 2500 MHz or more.

In order to dissipate the heat generated by the PCB's electronic components, a thermal plate 124 is capacitively coupled to the PCB 122. A heat sink 128 can be mounted to the thermal plate 124. The thermal plate 124 conducts heat away from the PCB 122 and transfers the heat to the heat sink 128. The thermal plate 124 is electrically conductive and is fabricated of a thermally conductive material. The heat sink 128 dissipates the heat by increasing the surface area for the heat to dissipate from and by increasing the air flow across the heated surface.

The processor module 120 can be a Single Edge Contact (SEC) cartridge manufactured by the Intel Corporation. The SEC supports "slot" type processors. A slot is a connector that is resident on a motherboard and which supports the Intel P6 microprocessor bus. Previously, microprocessors were mounted onto a motherboard through a socket. In a slot-type processor, the processor is placed on a PCB known as a single edge contact (SEC). The SEC has contacts on the edges of the card which are inserted into a slot or connector on the motherboard. This contact construction is otherwise known as an edge finger connection. The edge finger connection mates with the contacts inside of the connector. The edge finger connection provides circuit paths so that power, ground, and digital signals can be transferred between the PCB 122 and the motherboard. However, it should be noted that the technology of the present invention is not constrained to the SEC, to any particular circuit board, or to any particular circuit board layout.

The processor module 120 can be removably mounted onto a motherboard 136 or other type of circuit board. The motherboard 136 can be part of a computer system, subsystem, or the like.

The processor module 120 is fitted into a connector 138 that is mounted onto the motherboard 136. Preferably, the connector 138 is the slot type 2 or the SC330 connector that is based on Intel microprocessors. The slot type 2 connector is a 330-pin connector and more detailed information on this connector can be found in Intel Corporation, 330-Contact Slot Connector (SC330) Design Guidelines, order number 244428-001, September 1998, which is hereby incorporated by reference. However, it should be noted that the technology of the present invention is not limited to any particular connector and can be applied to any type of connector, slot, socket, or the like.

Figure 5:
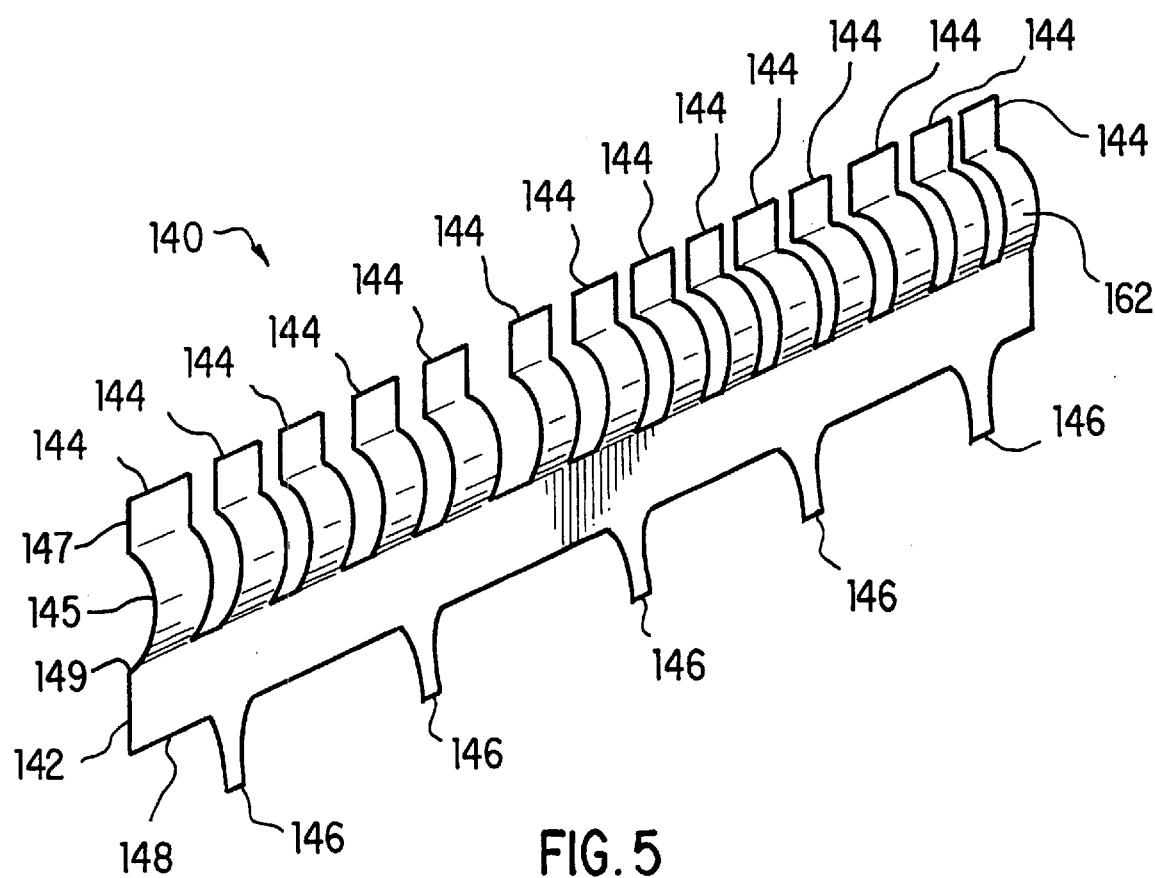
FIG. 5 is an isometric view of a grounding device.

FIG. 5 illustrates the grounding device, EMI reduction mechanism, or EMI reduction device 140. The grounding device 140 has a rectangular-shaped flat planar frame or longitudinal member 142 with a number of spring contact fingers 144 and mounting tabs 146. The spring contact fingers 144 serve as a positively-engaged spring that provides a pressure contact so that the grounding device 140 can maintain physical contact with the connector 138 and the thermal plate 124. The spring contact fingers 144 are positioned on the top edge 149 of the frame 142 and extend outward from the top edge 149 over the entire length of the frame 142.

Each spring contact finger 144 is generally arcuate and includes a cantilever spring portion 145 and a distal end 147. The spring portion 145 provides grounding contact points that make contact with the thermal plate 124. The spring portion 145 deflects downward when the thermal plate 124 is positioned over it thereby providing a pressure contact to maintain physical and electrical contact with the thermal plate 124. The distal end 147 allows the spring portion 145 to deflect along the surface of the connector 138.

The mounting tabs 146 extend outward from the bottom 148 of the frame 142. The mounting tabs 146 are used to support the grounding device 140 in its desired placement on the motherboard 136 and to maintain electrical contact with the ground plane of the motherboard 136.

The dimensions of the grounding device 140 are based on the connector 138 and the motherboard 136. The frame 142 of the grounding device 140 covers the outer or non-conductive surface 164 of the connector 138. As such, the height and length of the frame 142 is based on the height and length of the connector 138. The length of a mounting tab 146 is based on the thickness of the motherboard 136 since the mounting tabs 146 extend through the top surface 150 of the motherboard 136 through to the bottom surface 154.

The distance between adjacent mounting tabs 146 and between adjacent mounting holes 156 is dependent on the frequency of the processor's 131 clock. The higher the processor clock frequency, the smaller the distance that is required. For example, fractions of a wavelength (e.g., one-tenth) of the highest emission frequency can be the distance between each adjacent mounting tab 146 and mounting hole 156. The distance between the mounting tabs 156 would be smaller if more attenuation of the electromagnetic emissions were required.

It should be noted that the grounding device 140 is not constrained to the shape and dimensions described herein and one skilled in the art can easily modify the grounding device to accommodate other types of connectors, sockets, motherboards, and the like.

Preferably, the grounding device 140 is constructed of thin sheet metal for electrical conductivity and rigidity. It should be noted that the present invention is not constrained to any particular type of metal and can be constructed of any material, such as but not limited to stainless steel, beryllium copper, phospher bronze, hardened steel, spring steel, and the like. In addition, non-metallic or metallic materials can be plated with electrically-conductive plating suitable for electrical contact. However, the type of metal used is a factor in the number and dimensions of the spring contact fingers 144 and the mounting tabs 146 since the type of metal determines the rigidity of the grounding device 140.

Figure 6:
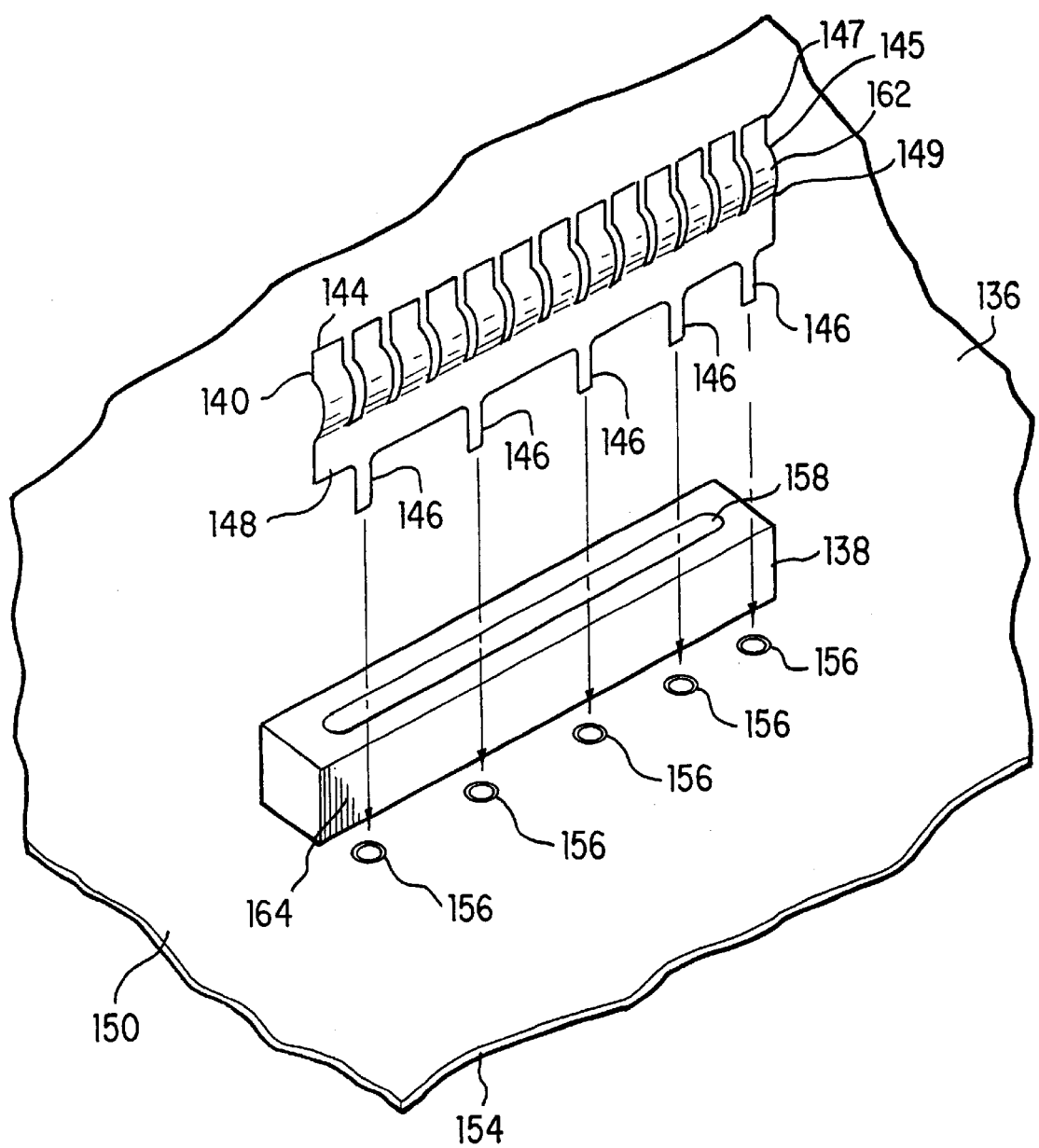
FIG. 6 illustrates the placement of the grounding device relative to a connector.
Figure 7:
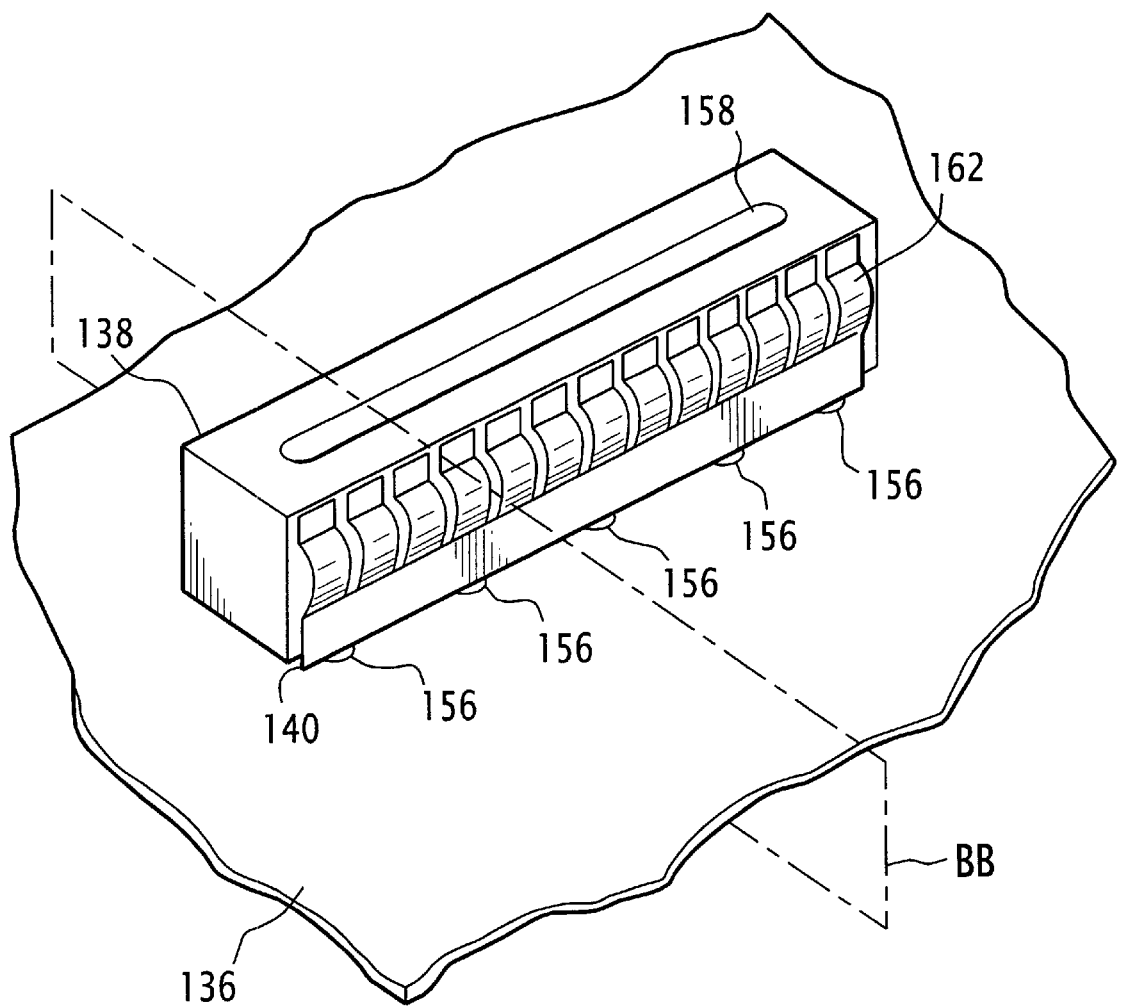
FIG. 7 is a perspective view of the grounding device positioned on a printed circuit board.

FIGS. 6 and 7 illustrate the placement of the grounding device 140 onto the motherboard 136 or other circuit board. The grounding device 140 is positioned so that it makes contact with the ground plane of the motherboard 136 and the outer surface 164 of the connector 138. The mounting tabs 146 are inserted into the respective mounting holes 156. The bottom edge 148 of the frame 142 rests on the top surface 150 of the motherboard 136. The inner side of the frame 142 and the distal end 147 are in contact with the outer surface 164 of the connector 138.

A number of mounting holes 156 are made in the motherboard 136 which extend from the top surface 150 of the motherboard 136 through to the bottom surface 154 of the motherboard 136. The mounting holes 156 are positioned in close proximity to the outer surface 164 of the connector 138 so that the spring contact fingers 144 maintain physical contact with the connector 138.

The arrows in FIG. 6 show the direction that the mounting tabs 146 are inserted into the mounting holes 156. Each mounting tab 146 of the grounding device 140 is then affixed into a respective mounting hole 156 by soldering the mounting tab 146 to the bottom surface 154 of the motherboard 136. Once the mounting tabs 146 are soldered to the motherboard 136, the processor module 120 can be fitted into the connector 138.

Figure 8:
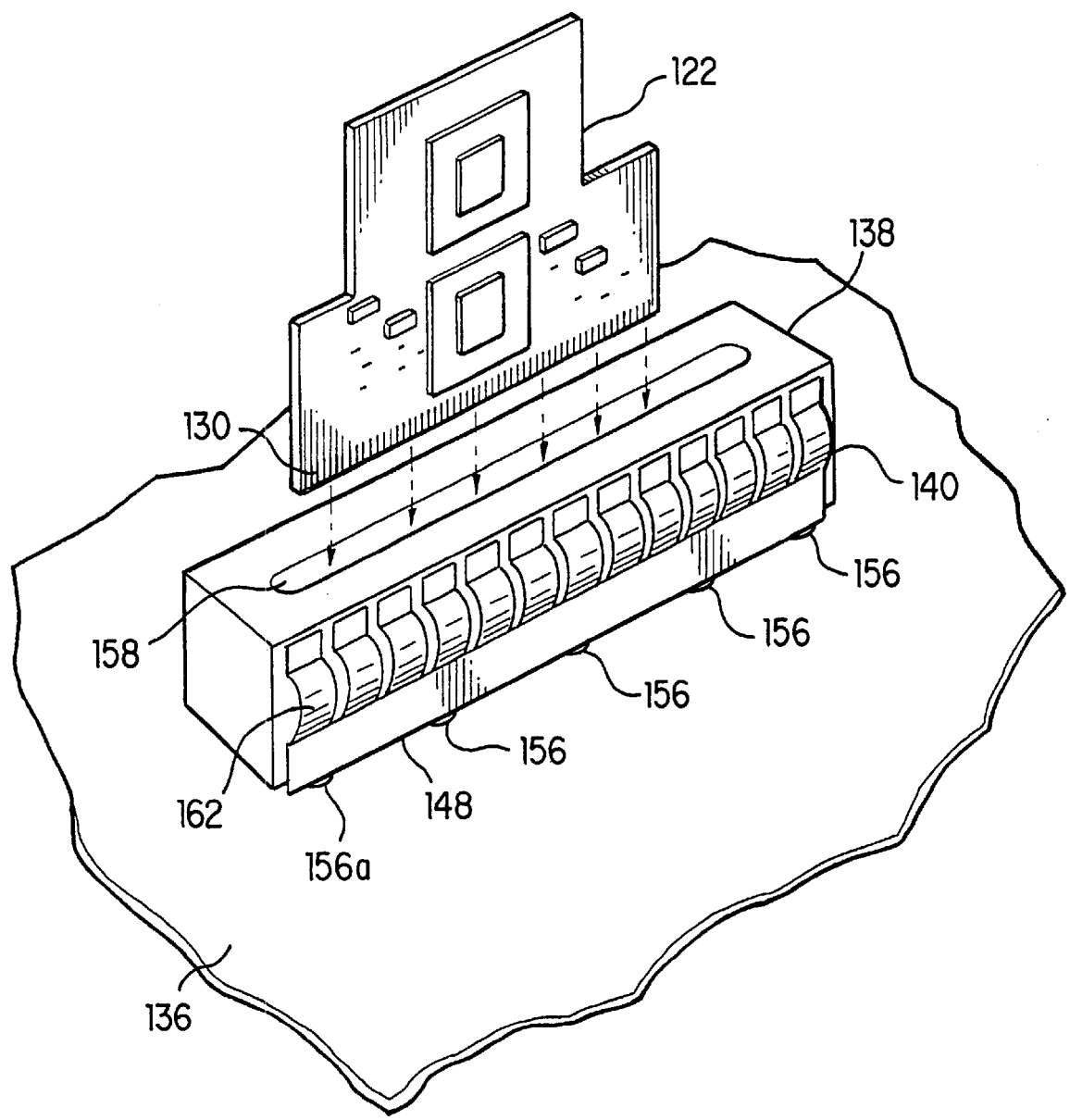
FIG. 8 illustrates the placement of a printed circuit board in the connector which is coupled to the grounding device.

The arrows in FIG. 8 show the direction that the PCB 122 is placed into the card slot 158 of the connector 138 so that the edge finger connection 130 of the PCB 122 is connected to the pins of the connector 138. However, it should be noted that the cover 126 and the thermal plate 124 of the processor module 120 have been omitted from FIG. 8 in order to clearly illustrate the insertion of the PCB 122 into the connector 138. Typically, the entire processor module 120 is positioned as a single unit into the connector 138 and the grounding device 140.

Figure 9:
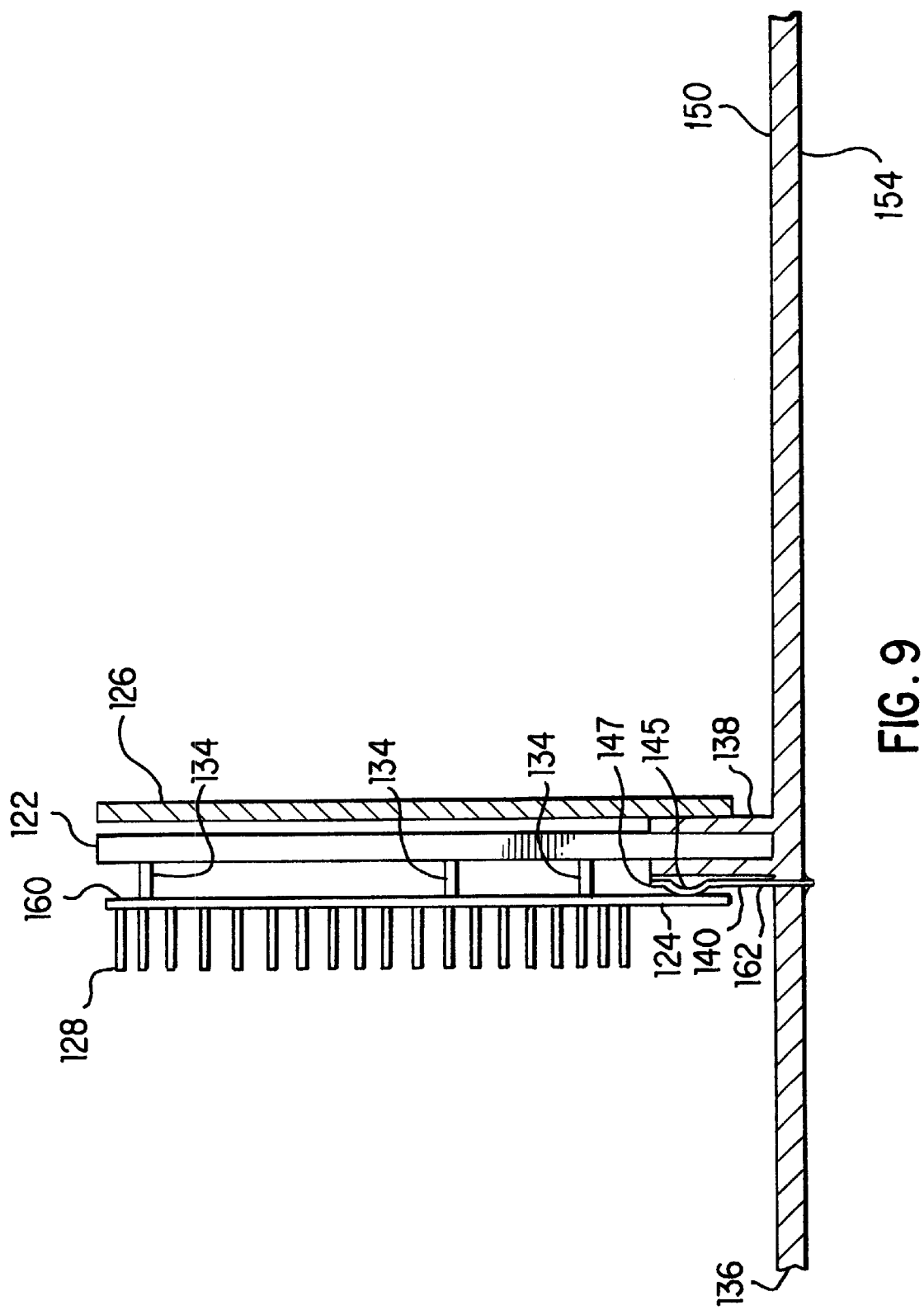
FIG. 9 is a cross-sectional view of the processor module taken along plane A—A and B—B when the processor module is positioned into the connector and the grounding device in accordance with a first embodiment of the invention.

As shown in FIG. 9, the thermal plate 124 is positioned so that its interior side or heat source side 160 makes contact with the grounding device 140. When force is applied to insert the processor module 120 into the connector 138, the thermal plate 124 slides on the outer surface 162 of the grounding device 140 thereby forcing the spring contact fingers 144 to deflect. The deflected spring contact fingers 144 apply pressure against the thermal plate 124 which, in turn, causes the thermal plate 124 to maintain electrical contact with the grounding device 140.

The grounding device 140 is used to ground the currents that cause the electromagnetic emissions generated from the processor core 131 and the other electronic components on the PCB 122 to the ground plane of the motherboard 136. The grounding device 140 is electrically coupled to the thermal plate 124 and to the ground plane of the motherboard 136. The thermal plate 124 is not electrically coupled to the PCB 122 rather capacitively coupled to the PCB 122 through the physical connection of the processor 131 and the PCB's electrical components. Thus, a ground path is provided from the thermal plate 124, to the grounding device 140, and to the ground plane of the motherboard 136.

The grounding device 140 described above has several advantages. First, it provides a short grounding path from sources of emissions to a ground plane. In addition, the grounding device 140 provides a lower impedance grounding path because of the multiple contacts provided by the spring contact fingers 144. As a result of these advantages, the grounding device 140 is effective at reducing the electromagnetic emissions generated from the processor module 120. Additionally, the grounding device 140 offers a grounding reference plane which improves the signal integrity characteristics of the connector pins (or contacts) by maintaining a more stable transmission line characteristic.

Furthermore, the fact that the grounding device 140 is separate from the connector 138 lends itself to more applications since it can be easily adaptable for use with any type of connector. Grounding devices situated inside the connector are limited since they are constrained to a particular pin configuration or connector design. The use of a separate grounding device which is external to the connector alleviates the constraints imposed by the connector design.

The foregoing description, for purposes of explanation, used specific nomenclature to provide a thorough understanding of the invention. However, it will be apparent to one skilled in the art that the specific details are not required in order to practice the invention. In other instances, well known electronic components and devices are shown in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The grounding device 140 is not limited for use with a thermal plate 124 and can be used with any device that transmits currents resulting in electromagnetic emissions, including but not limited to, a thermal plate, a heat sink, any type of heat transfer device, circuit board, or the like.

Figure 10:
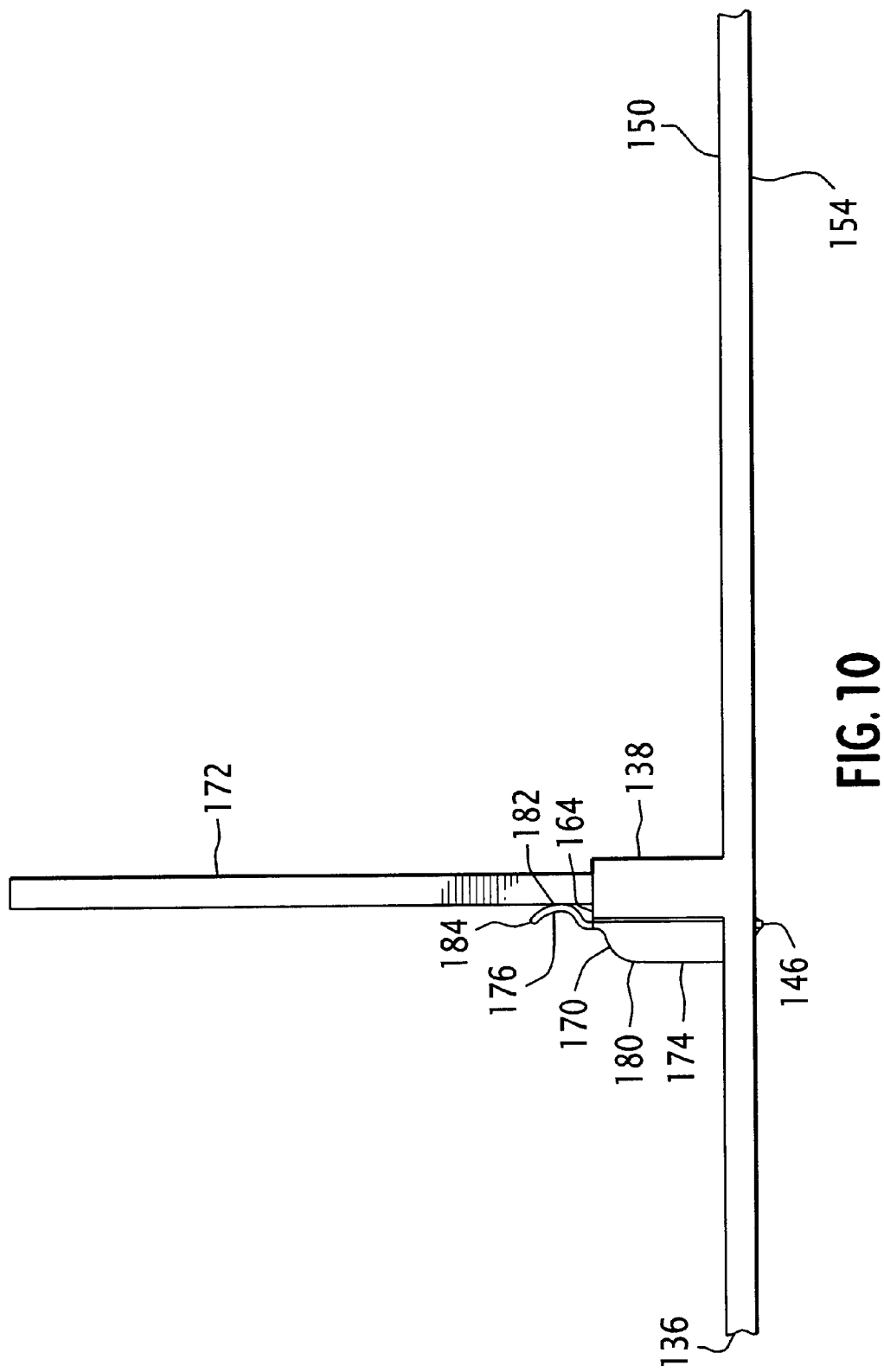
FIG. 10 is a side view of a circuit board positioned into a connector and the grounding device in accordance with a second embodiment of the invention.

FIG. 10 illustrates a second embodiment of the grounding device 170. In this embodiment, the grounding device 170 is in direct contact with a PCB 172. The PCB 172 is not attached to a thermal plate, heat sink, cover, or other device. The PCB 172 is mounted into a connector 138.

The grounding device 170 has a rectangular-shaped frame or longitudinal member 174 with a number of spring contact fingers 176 and mounting tabs 178. The frame 174 includes a rib or support portion 180 that rests on the outer surface of the connector 138. The rib 180 is used to ensure that the grounding device 170 maintains physical contact with adequate pressure on the connector 138.

Each spring contact finger 176 include a cantilevered spring portion 182 and a distal end 184. The spring portion 182 makes contact with the PCB 172. The mounting tabs 146 are identical to the mounting tabs 146 of the grounding device 140 described above.

In this embodiment, the grounding device 170 is electrically coupled to the PCB 172 and as such, provides a short low-impedance ground path to the ground plane of the motherboard 136. In addition, this grounding device 170 is advantageous in situations where physical contact with the PCB 172 is possible.

What is claimed is:

1. An assembly comprising:
   a) a motherboard having a ground plane;
   b) a slot connector mounted on said motherboard and having an exterior surface;
   c) an electromagnetic emission reduction apparatus mounted on said motherboard adjacent to said exterior surface of said slot connector and in electrical connection with said motherboard ground plane;
   d) a processor module mounted in said slot connector and positioned in contacting relationship with said electromagnetic emission reduction apparatus;
      said processor module comprising a printed circuit board and a heat dissipation assembly; said electromagnetic emission reduction apparatus contacting said heat dissipation assembly.

2. The assembly of claim 1, said heat dissipation assembly comprising a thermal plate contacting said electromagnetic emission reduction apparatus.

3. An assembly comprising:
   a) a motherboard having a ground plane;
   b) a slot connector mounted on said motherboard and having an exterior surface;
   c) a spring metal member mounted on said motherboard adjacent to said exterior surface of said slot connector and in electrical connection with said motherboard ground plane;
   d) a processor module mounted in said slot connector and positioned in contacting relationship with said spring metal member;
      said processor module comprising a printed circuit board and a heat dissipation assembly; said spring metal member contacting said heat dissipation assembly.

4. A method for reducing electromagnetic emissions from a processor module mounted in a slot connector on a mother board comprising:

mounting an electrically conductive member on the motherboard adjacent to an exterior surface of the slot connector; and contacting the processor module with the conductive member;

wherein contacting the processor module with the conductive member comprises contacting a heat dissipation assembly portion of the processor module with the conductive member.

\* \* \* \* \*